United States Patent [19]

Homma et al.

[11] Patent Number: 4,986,666

[45] Date of Patent: Jan. 22, 1991

[54] SEMICONDUCTOR MEMORY DEVICE

[75] Inventors: Noriyuki Homma, Kodaira; Hisayuki Higuchi, Kokubunji; Yoji Idei, Asaka; Hiroaki Nambu, Hachiouji; Yoshiaki Sakurai, Kokubunji, all of Japan

[73] Assignees: Hitachi Device Engineering Co., Ltd.; Hitachi Ltd., both of Tokyo, Japan

[21] Appl. No.: 277,261

[22] Filed: Nov. 29, 1988

[30] Foreign Application Priority Data

Dec. 2, 1987 [JP] Japan .............................. 62-304998
Mar. 16, 1988 [JP] Japan ................................ 63-60377

[51] Int. Cl.$^5$ ...................... G11C 7/00; H01L 29/70
[52] U.S. Cl. ........................ 365/230.08; 365/230.06; 365/189.05; 365/189.06
[58] Field of Search ................ 365/230.06, 230.08, 365/242, 194, 189.05, 189.06, 189.07, 189.11

[56] References Cited

U.S. PATENT DOCUMENTS

| | | | |
|---|---|---|---|
| 4,195,358 | 3/1980 | Yuen | 365/230.06 |
| 4,612,631 | 9/1986 | Ochii | 365/189.05 X |
| 4,701,889 | 10/1987 | Ando | 365/189.05 X |
| 4,740,923 | 4/1988 | Kaneko et al. | 365/194 |

Primary Examiner—Joseph A. Popek
Attorney, Agent, or Firm—Fay, Sharpe, Beall, Fagan, Minnich & McKee

[57] ABSTRACT

A semiconductor memory device capable of operating at high speeds, and a sense circuit and a decoder circuit that can be suitably used for the memory device. A latch function is imparted to at least either one of the decoder circuit or the sense circuit in the semiconductor memory device.

15 Claims, 19 Drawing Sheets

SEMICONDUCTOR MEMORY DEVICE

BACKGROUND OF THE INVENTION

The present invention relates to a semiconductor memory device, and particularly to a semiconductor memory device of the type of pipeline operation that is capable of operating at a high speed owing to the reduction in the cycle time.

It is widely accepted practice to provide a latch circuit in a semiconductor memory device. For instance, Japanese Patent Laid-Open No. 58-128097 discloses an art in which an address latch circuit is provided in the input portion (address buffer portion) of the address decoder and an output latch circuit is provided in the data output portion (output buffer portion). With the latch circuits being incorporated in the semiconductor memory device as described above, the memory circuit can be operated with a cycle time which is slightly greater than the delay time of a circuit between the latch circuits; i.e., the so-called pipeline operation can be effected to increase the operation speed of the memory circuit.

According to the above-mentioned prior art, however, an address decoder, a memory cell array unit and a sense circuit are inserted between the address latch circuit and the output latch circuit making it difficult to reduce the cycle time in the memory operation to be shorter than the sum of delay times of these three circuits.

Sense circuits in the memory devices have been disclosed, for example, in (1) "A 4K-bit Static $I^2L$ Memory" (Kawarada et al.), IEEE Transactions on Electron Devices, Vol. ED-26, No. 6, June 1979, pp. 886–892, (2) Japanese Patent Laid-Open No. 53-39049, and (3) "A 12 ns/350 mW 16 Kb ECL Compatible RAM" (Okada et al.), ESSCIRC-85, Digest of Technical Papers, Sept., 1985, pp. 166–176.

Furthermore, a conventional semiconductor circuit used as an address decoder circuit in the memory device can be represented by a circuit of the type in which a wired OR gate based on the ECL gate and a NAND gate are combined together as a decoder circuit for the bipolar memory (e.g., see Japanese Utility Model Registration No. 1481216).

FIG. 1 illustrates a decoder circuit based on the ECL gate that has heretofore been used, containing three buffer circuits $XB_0$, $XB_1$, and $XB_2$. The buffer circuit $XB_0$ consists of two transistors $Q_1$, $Q_2$, two resistors $R_1$, $R_2$, a current source Is, and eight emitter followers $EF_1$, ..., $EF_8$. The buffer circuits $XB_1$ and $XB_2$ have also been constituted in the same manner. Outputs of the emitter followers are suitable combined and partially decoded by means of wired OR. In the diagramed example, outputs of the buffer circuits $XB_0$, $XB_1$ and $XB_2$ are partially decoded by wired OR in order to obtain eight partially decoded outputs $\overline{X_2} \cdot \overline{X_1} \cdot \overline{X_0}$, ..., $X_2 \cdot X_1 \cdot X_0$. These outputs are low when the input addresses are particularly combined. For example, the output $\overline{X_2} \cdot \overline{X_1} \cdot \overline{X_0}$ is low only when all inputs $X_0, X_1$ and $X_2$ are high. In FIG. 1, the output $\overline{X_2} \cdot \overline{X_1} \cdot \overline{X_0}$ is connected to an input (base of the transistor $Q_{C1}$) of the NAND gate GO.

In the above-mentioned conventional decoder circuit, the delay time increases with the increase in the number of wired OR's. By contrast when the number of the wired OR's is decreased the number of NAND inputs of the ECL gate increases for receiving the wired OR outputs, and thereby the time constant of the collector of the NAND gate increases causing the delay time to be increased. In practice, the device is designed finding a suitable compromising point between the two, which makes it difficult to accomplish the high-speed operation. Therefore, a transistor gate (see Japanese Patent Publication No. 60-20836) equipped with a pull-up circuit has been used as a high-speed decoder. In the decoder of this system, in general, the amplitude of the decoder line is determined by the amplitude of the word line, and is relatively large. Therefore, one of the effective method of operating the decoder of this type at high speeds is to decrease the amplitude of the decoder line. When the amplitude is decreased, however, the output level greatly varies depending upon the logical combination of the address inputs, making it difficult to accomplish high-speed operation. Furthermore, compared with the above-mentioned decoder of the type in which the wired OR and the ECL gate are combined together, the decoder of this type operates at a very high speed but requires complex circuit structure and is difficult to design. Moreover, it is difficult to decrease the width of the wiring for supplying large currents to the decoder lines, which imposes limitations on increasing the degree of integration.

SUMMARY OF THE INVENTION

The object of the present invention is to provide a semiconductor memory device that is capable of operating at high speeds exceeding the limit of operation cycle time imposed by the prior art.

Another object of the present invention is to provide a sense circuit that can be suitably used for the semiconductor memory devices that operate at high speeds.

A further object of the present invention is to provide a semiconductor circuit that works as an address decoder circuit in the semiconductor memory devices that operate at high speeds.

In the memory device of the present invention, a latch function is imparted to at least either the decoder circuit (address decoder) or the sense circuit in the semiconductor memory device in order to achieve the above-mentioned objects. Preferably, however, the latch function should be imparted to both of these circuits. As concrete means, the address decoder or the sense circuit should be so constituted as to incorporate the latch function therein. The circuit constitution will be described later in detail by way of embodiments. According to the memory device of the present invention constituted as described above, even the address decoder or the sense circuit exhibits the latch function between the two latches in the address buffer portion and the output buffer portion mentioned in the above prior art. Therefore, the sum of delay times of the circuits inserted among the latches can be further shortened in order to shorten the cycle time in the memory operation, i.e., to increase the speed of the operation.

The operation carried out at high speeds will be described below in further detail. When a signal is successively transmitted through a series of constitutional elements of a device such as the memory device of the present invention, predetermined portions in the series of elements are sectionalized by the latch circuits to control the transmission of signal in response to a clock, which is a so-called pipeline operation. The pipeline operation has been carried out, for example, in a high-speed processor circuit. In the pipeline operation, a clock period is set which is slightly longer than the delay time of the circuit in a section sectionalized by the latch circuit, and the data held in the latch circuit is transmitted to the circuit of the next stage according to a clock. That is, in the same clock period, the individual processes are separately carried out in each of the sections sectionalized by the latch circuits. Furthermore, the particular input data are successively transmitted to the next sections for each of the clocks. By shortening the delay time of the circuit inserted between the latch circuits, therefore, the clock period for controlling the pipeline operation can be shortened, so that the memory device as a whole operates at high speeds.

In the sense circuit of the present invention, a current switch is connected in parallel with the sense output portion to produce a function for latching the sense output. As concrete means, a current switch is added to feed the sense output back, and a current is switched in response to a clock to either one of the current switches added by the sense circuit, thereby to produce the latch function. The circuit in a portion other than the above-mentioned circuit added to impart the latch function, may include a widely known collector dot-type sense circuit. Examples of the collector dot-type sense circuit without latch function can be represented by the circuits shown, for example, in FIGS. 2 to 4. These circuits are the ones obtained by modifying the circuits disclosed in the literatures that are referred to in the foregoing paragraph of the prior art.

According to the sense circuit of the present invention constituted as described above, the latch function can be imparted to the sense circuit by slightly changing the conventional sense circuit causing neither the increase in the area (chip area) occupied by the circuits nor the increase in the memory access time.

The art that deals with the sense circuit of the present invention is distinctly different from a simple combination of the sense circuit and the latch circuit in which a conventional latch circuit is connected in cascade to the output of the conventional sense circuit. Namely, the feature of the sense circuit of the present invention resides in that the sense circuit incorporates a latch functional portion that is connected in parallel with the sense output thereof.

Furthermore, the semiconductor circuit that works as an address decoder of the present invention comprises a plurality of input transistors whose emitters and collectors are commonly connected, and a reference voltage transistor whose emitter is connected in common to the emitters of the plurality of input transistors, and is further provided with clamping means for suppressing the potential change in the common collectors.

The above clamping means has a feature in that it has a transistor whose emitter is connected to the common collectors of the plurality of input transistors, whose base is connected to a voltage source having a low impedance, and whose collector is connected to a load resistance, and further has a feature in that a current source is connected to the common collectors.

The semiconductor circuit can be operated by applying the outputs of the plurality of buffer circuits to the bases of the plurality of input transistors.

In the present invention, a common collector node of the NAND gates is clamped by a transistor, and the voltage amplitude at the node becomes very small. Therefore, the delay time increases very little even when the number of inputs (number of input transistors and the like) of the NAND gates is increased. Therefore, response of the buffer circuit and the emitter followers is very quickened when the number of inputs of the NAND gates is increased and, instead, when the number of wired OR's based on the emitter followers is decreased, or when the wired OR's are omitted.

Figure 14:
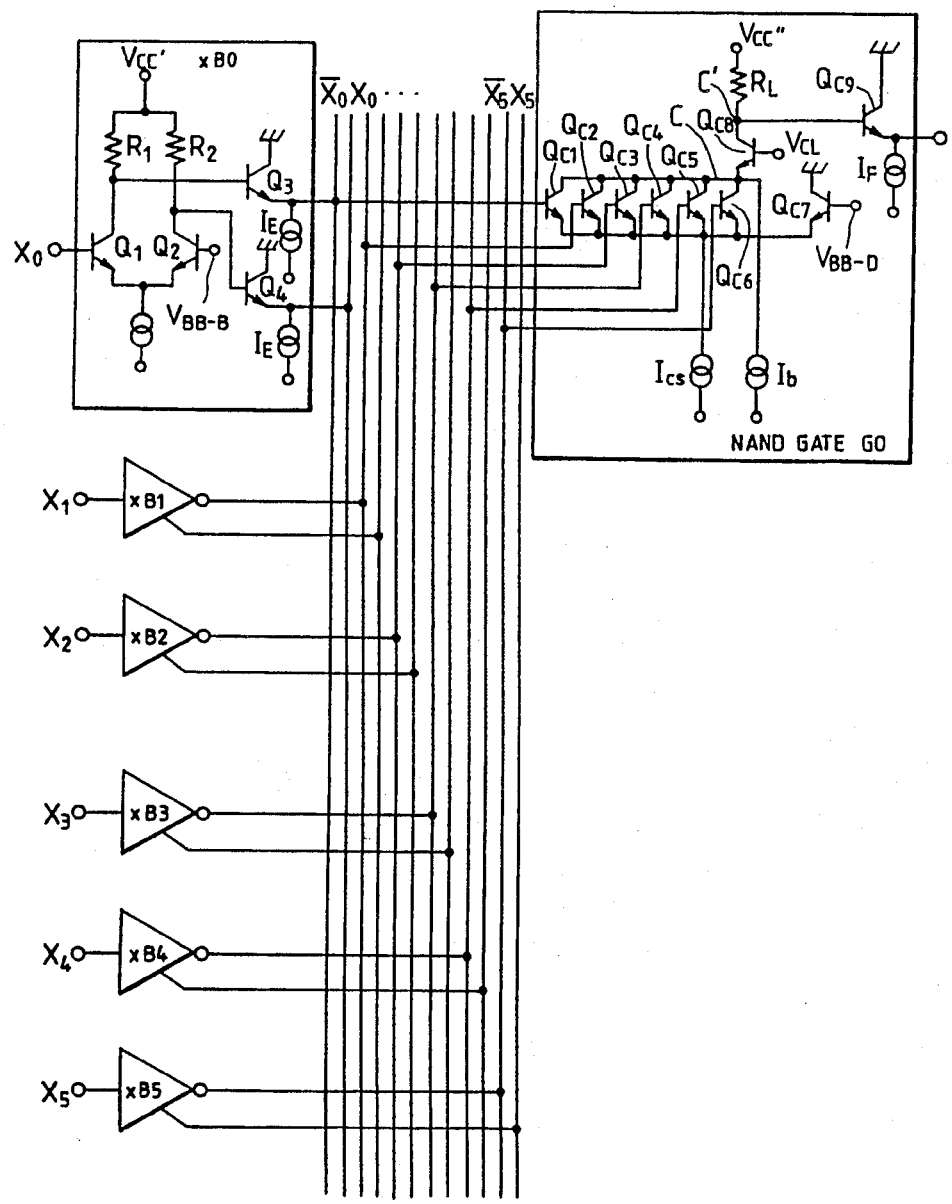
Figure 15:
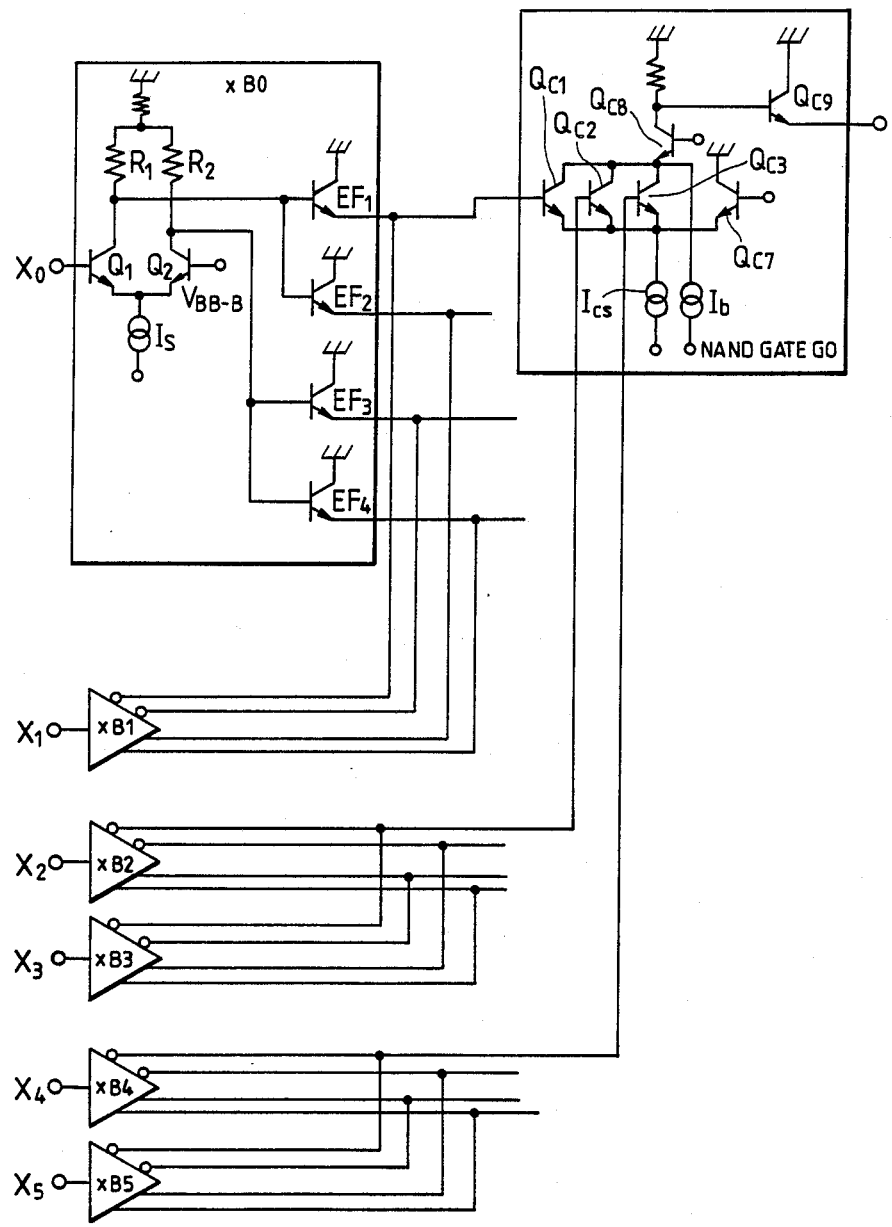
Figure 16:
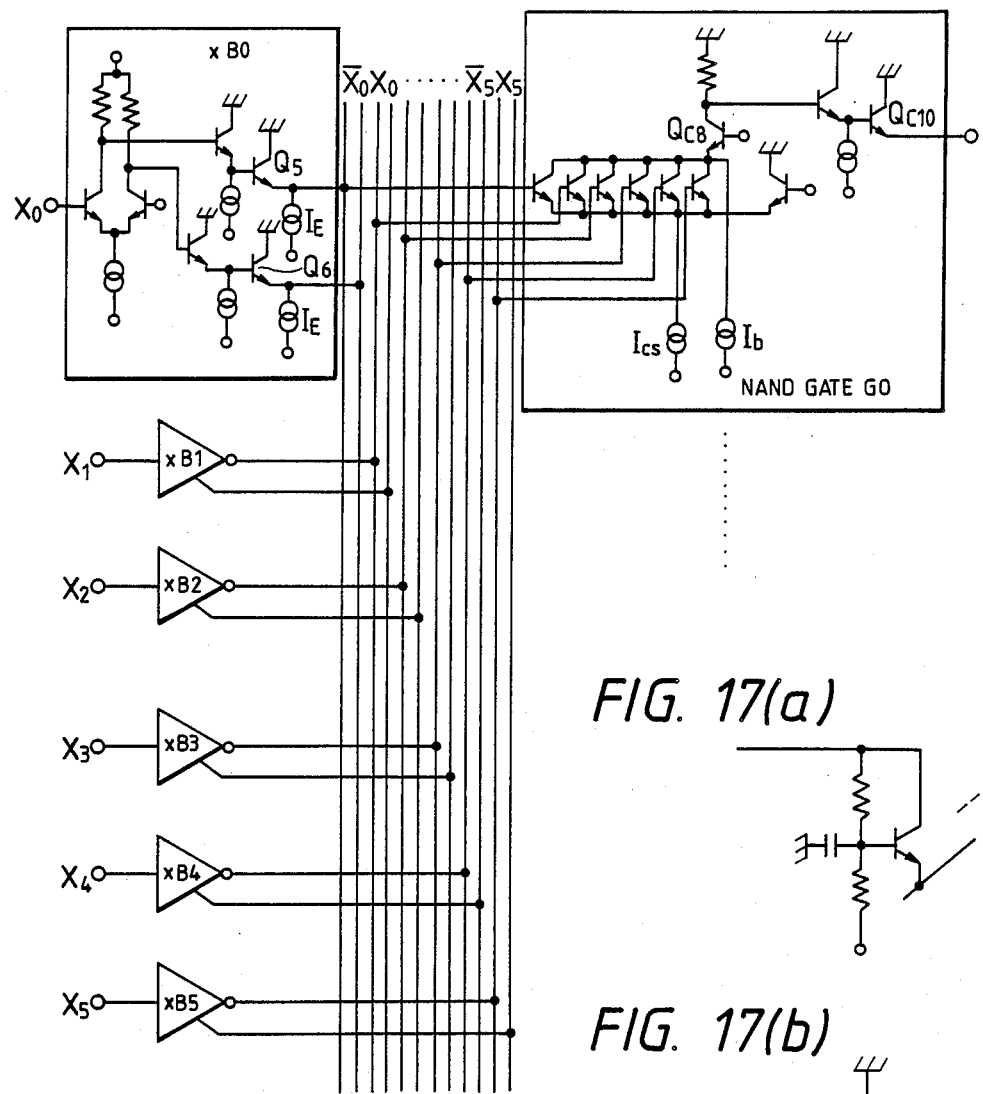
Figure 17A:
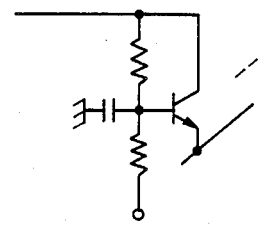
Figure 17B:
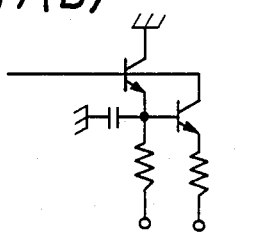
Figure 18:
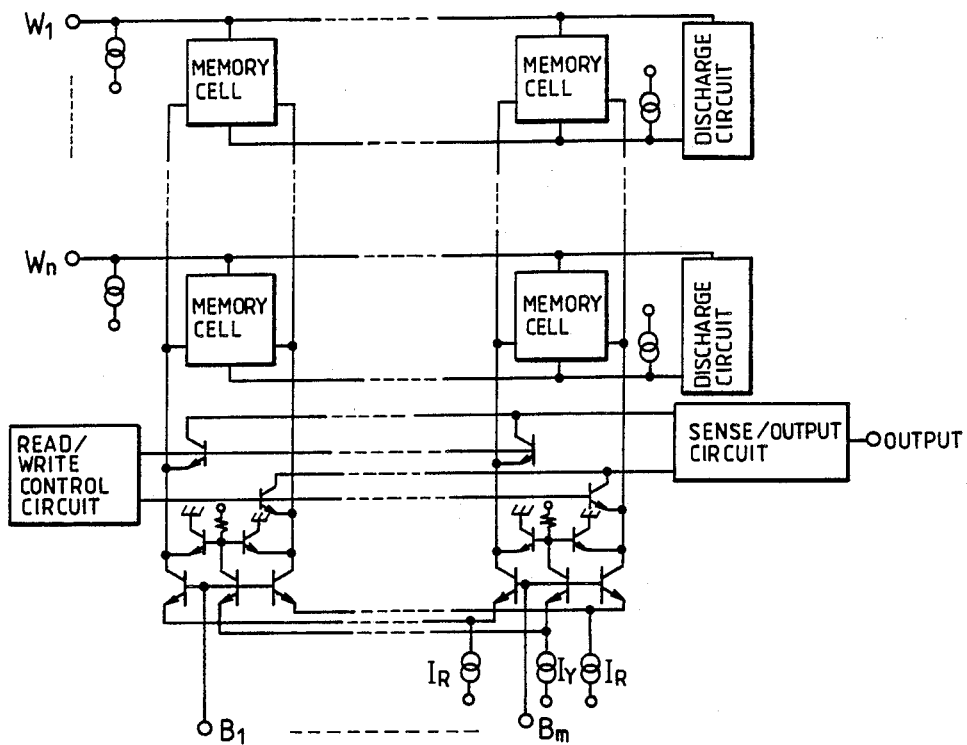
Figure 19:
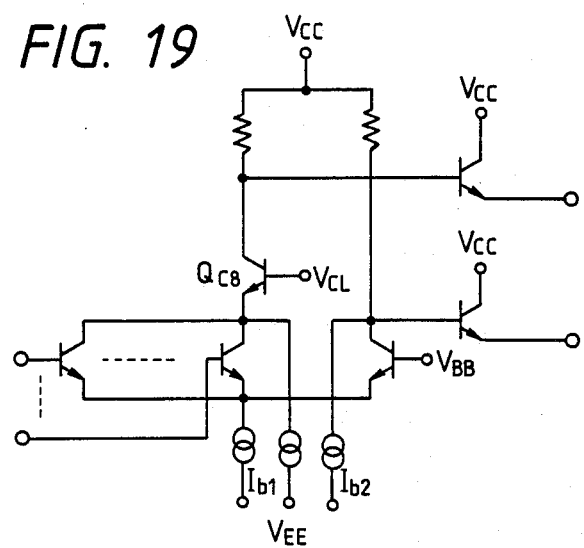
Figure 24:
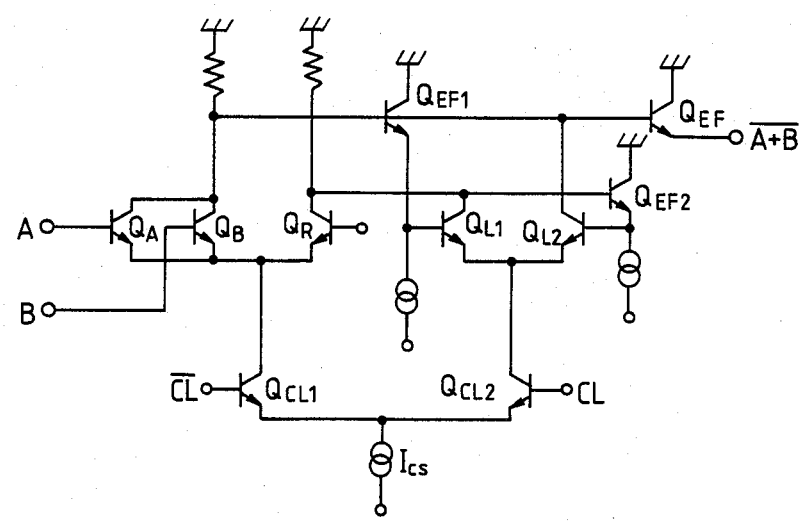

wherein in FIGS. 2 to 4, 8 and 13, symbols $Q_1$, $Q_2$, $Q_3$, $Q_{L1}$, $Q_{L2}$, and $Q_{L3}$ denote transistors, and $D_0$ and $\overline{D_0}$ denote digit lines;

FIG. 14 is a diagram illustrating the constitution of a decoder circuit in a semiconductor circuit according to an embodiment of the present invention;

FIGS. 15 and 16 are diagrams illustrating the constitutions of decoder circuits in a semiconductor circuit according to further embodiments of the present invention;

FIG. 17A and 17B is a diagram illustrating current source circuits for electric discharge;

FIG. 18 is a diagram illustrating a memory circuit driven by the output of the decoder circuit according to the present invention;

FIG. 19 is a diagram illustrating the constitution of a multi-input ECL gate in the semiconductor circuit according to a further embodiment of the present invention;

FIGS. 20 to 23 are diagrams illustrating the constitutions of decoder circuits in the semiconductor circuit according to yet further embodiments of the present invention;

wherein symbols $Q_{C1}$ to $Q_{C3}$ denote input transistors, $Q_{C7}$ denote a reference voltage transistor, $Q_{C8}$ denote a transistor for clamping the potential variation in the common collectors, and $I_b$ and $I_{CS}$ denote current sources; and FIG. 24 is a diagram illustrating the constitution of a buffer circuit with latch in the memory device of the present invention.

DESCRIPTION OF THE PREFERRED EMBODIMENTS

Figure 5:
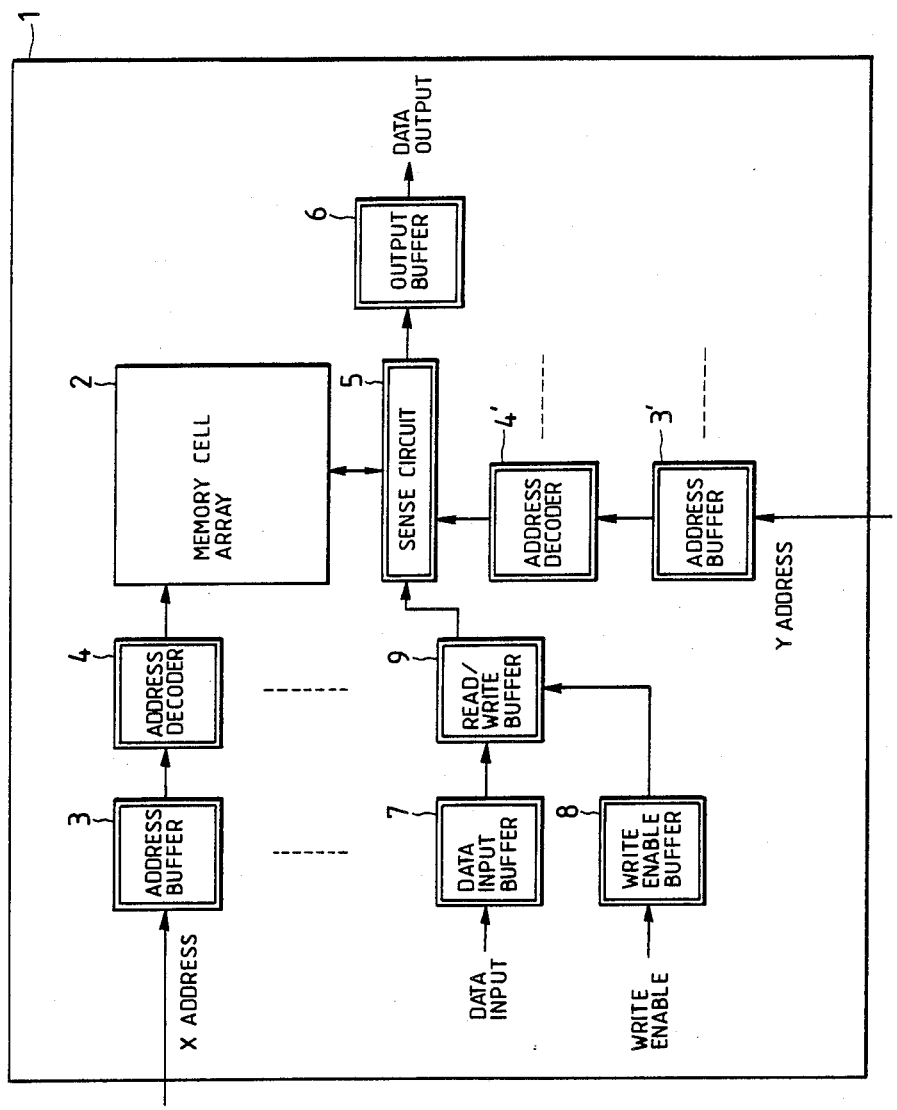
FIG. 5 is a block diagram illustrating the entire constitution of a semiconductor memory device according to an embodiment of the present invention.

FIG. 5 is a block diagram illustrating the whole constitution of a semiconductor memory device according to the present invention. In the memory circuit of this embodiment, both the address decoder and the sense circuit have a latch function in addition to the latch functions of the address buffer portion and the output buffer portion of the prior art. Furthermore, the whole elements of FIG. 5 can be mounted in a single LSI chip. This embodiment deals with such a case.

A memory cell array 2 in the memory circuit 1 is addressed by X- and Y-addresses. The X- and Y-addresses input to the memory circuit 1 are supplied to the memory cell array 2 through address buffers 3, 3' and address decoders 4, 4'. The data read from a memory cell (memory cells which are not shown exist in many number in the memory cell array) accessed by the X- and Y-addresses is detected by a sense circuit 5, and is read through an output buffer 6. As described above, the input buffers 3, 3', address decoders 4, 4', sense circuit 5, and output buffer 6 have a latch function. In FIG. 5, the constitutional elements that have a latch function are surrounded by double frames. Reference numeral 7 denotes a data input buffer, 8 denotes a write enable buffer, and 9 denotes a read/write buffer, which also have a latch function, respectively.

Figure 6:
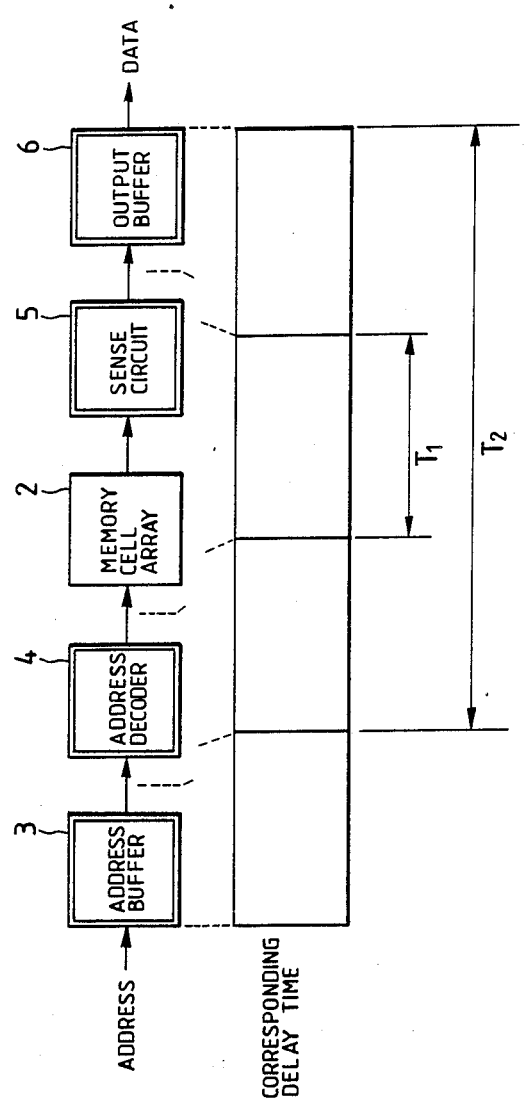
FIG. 6 is a diagram illustrating a signal transmission path and the content of access time in the memory device.

FIG. 6 illustrates a signal transmission path (upper stage) for determining the access time in the memory device and contents (lower stage) of the access times corresponding to each of the constitutional elements. As will be understood from FIG. 6, in the case of this embodiment in which all of the circuits have a latch function except the memory cell array, the pipeline operation can be effected with a period $T_1$ of FIG. 6 which is slightly longer than a maximum delay time among the delay times of each of the circuits. According to the conventional art in which the address buffer and the output buffer only have a latch function, on the other hand, the operation cycle is carried out with a period $T_2$ of FIG. 6. According to the present invention as described above, the memory device operates at a strikingly increased speed.

Figure 7:
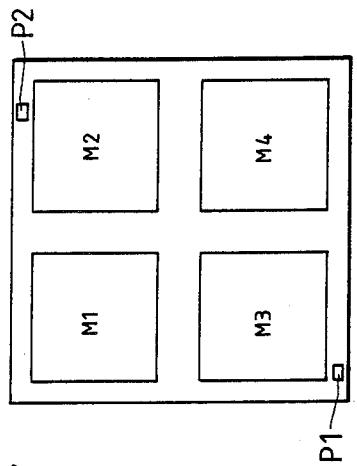
FIG. 7 is a diagram of a mat arrangement in a memory array according to a modified embodiment of the present invention.

In the aforementioned embodiment, furthermore, the address buffer, address decoder, sense circuit and output buffer are all provided with a latch function. However, it is also allowable to further insert latch circuits among these circuits to constitute a pipeline memory consisting of many stages. A modified embodiment will now be described in conjunction with FIG. 7, wherein the memory cell array is divided into four mats M1 to M4 in the memory chip. Each mat includes the address decoder up through to the sense circuit of FIG. 6. Described below is the case where one of the address inputs (outputs of address buffer) is input to, for example, a pad P1. In this case, the mat M3 is near but the mat M2 is remote, and a considerable difference develops in the time until the address signal reaches. To adjust this difference, therefore, it is recommended to provide a latch circuit between, for example, the address buffer and the address decoder. Furthermore, when the output signal goes out of the chip through the pad P2, the mat M2 is near but the mat M3 is remote contrary to the above-mentioned case. In this case, also, it is recommended to provide a latch circuit between, for example, the sense circuit and the output buffer in order to adjust the signal arrival time.

The constitutional elements in the memory device shown in FIG. 5 will now be described.

First, the most characteristic sense circuit will be described among the above-mentioned constitutional elements. Constitution of the sense circuit without latch function can be represented by the circuits shown in FIGS. 2 to 4. The sense circuit described in the following embodiment consists of the circuits of FIGS. 2 to 4 but having a latch function, and is suited for being used in the memory device of the present invention which operates at high speeds.

Figure 1:
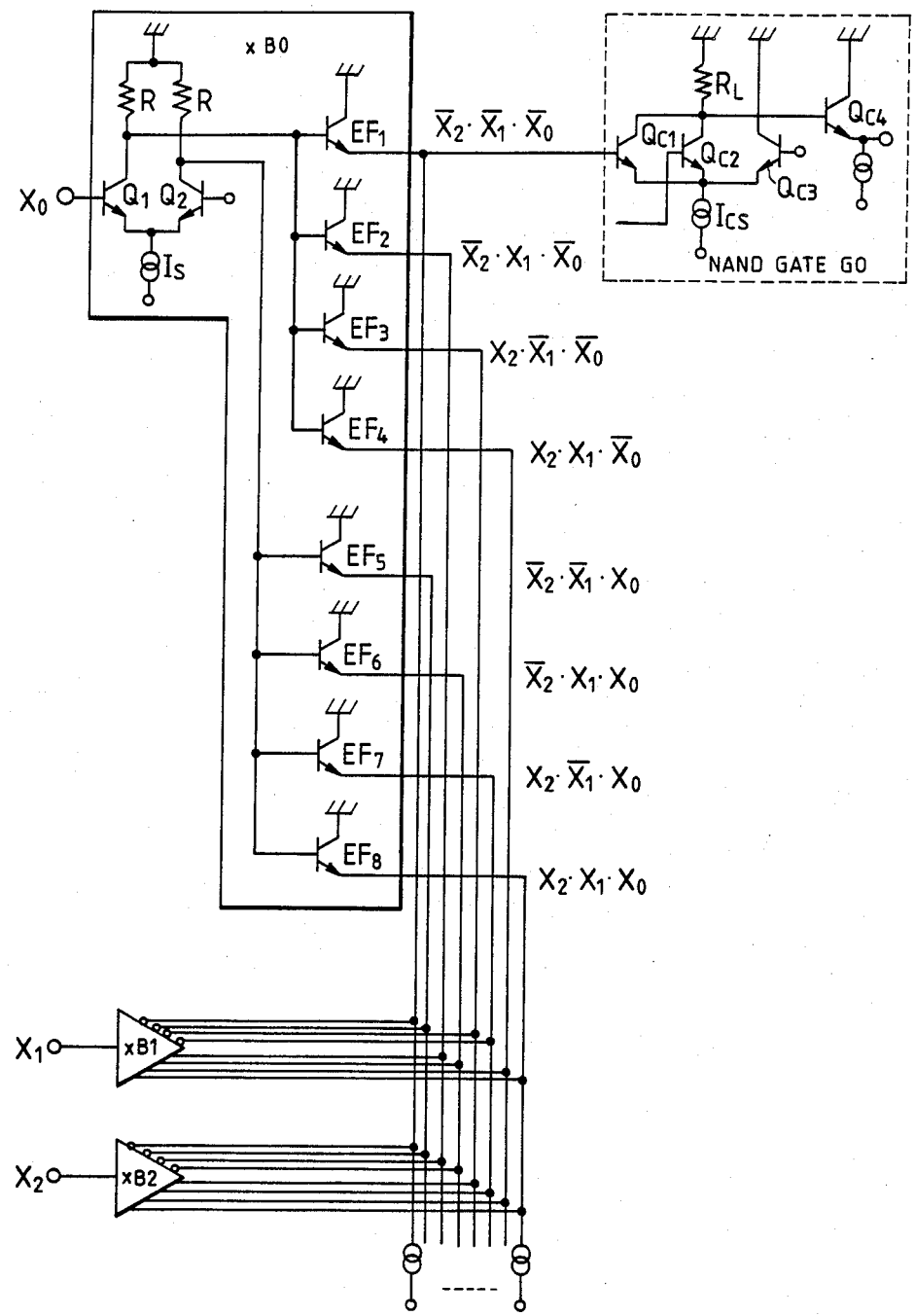
FIG. 1 is a diagram illustrating the constitution of a conventional decoder circuit.
Figure 2:
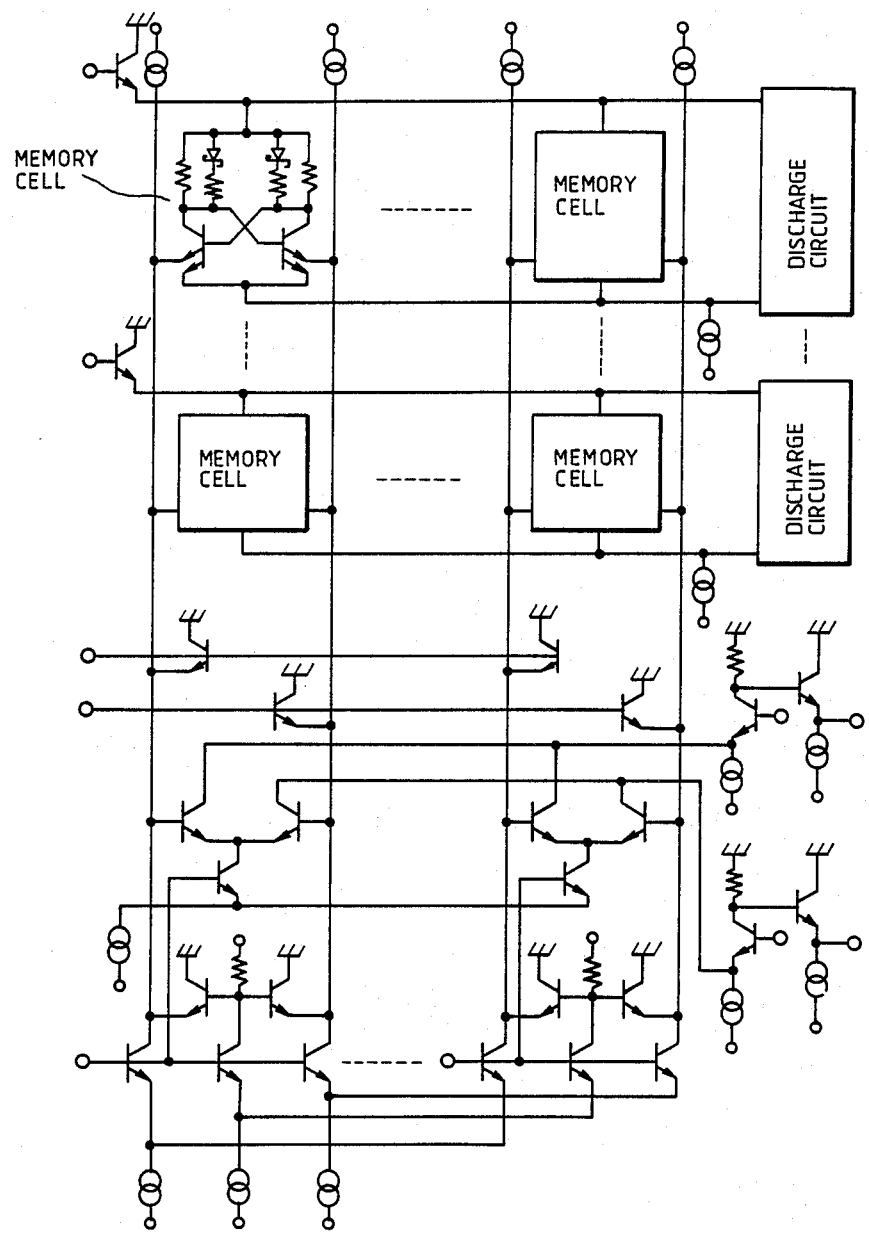
FIGS. 2, 3 and 4 are diagrams illustrating the constitutions of sense circuits without latch function.
Figure 8:
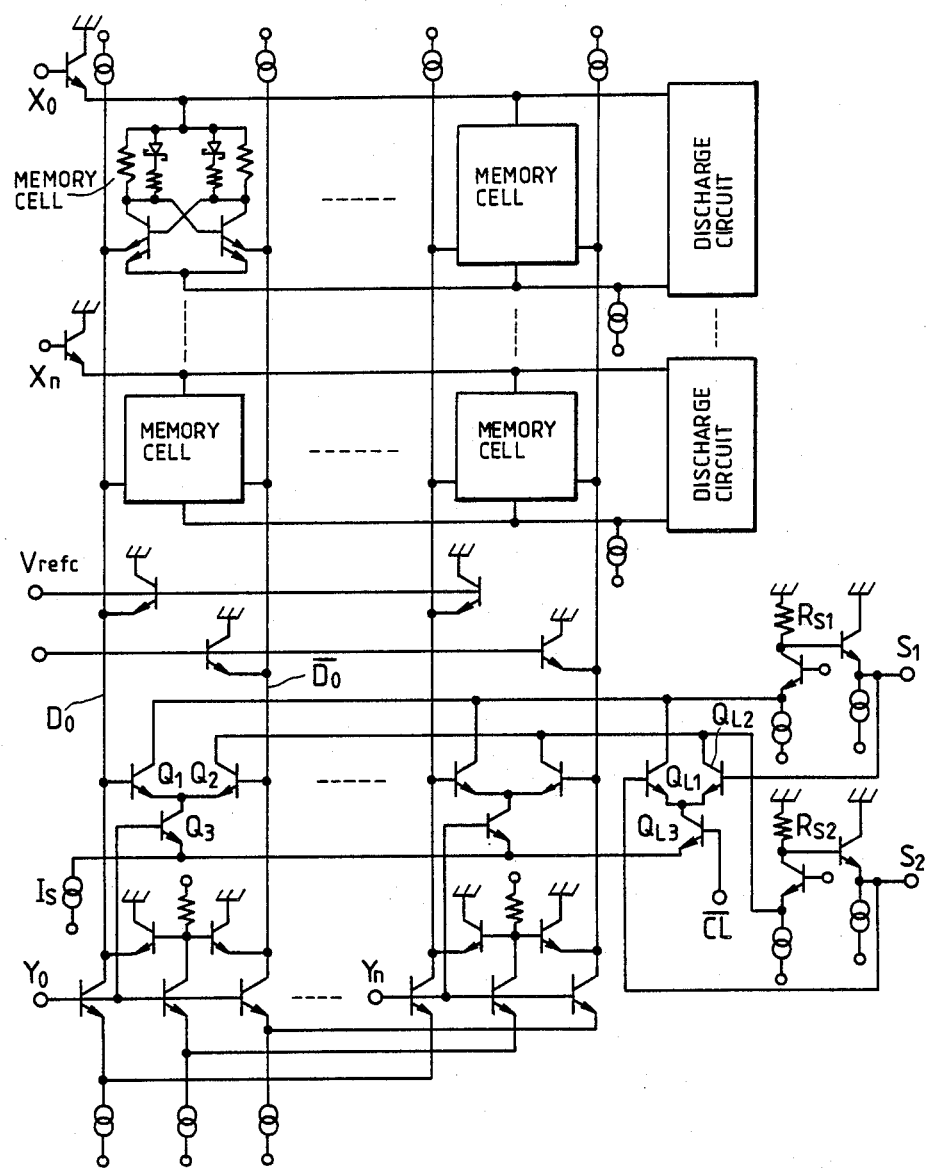
FIG. 8 is a diagram of a sense circuit which is provided with a latch circuit according to the embodiment of the present invention.

FIG. 8 illustrates an embodiment in which the sense circuit of FIG. 2 is provided with a latch function. In this embodiment, a circuit consisting of transistors $Q_{L1}$, $Q_{L2}$ and $Q_{L3}$ is provided in parallel with a sense circuit which consists of transistors $Q_1$, $Q_2$ and $Q_3$. Sense outputs $S_2$ and $S_1$ are applied to the bases of the transistors $Q_{L1}$ and $Q_{L2}$. A clock signal $\overline{CL}$ is applied to the base of the transistor $Q_{L3}$. When the clock signal has a low level, a sense current Is flows into a selected sense circuit. When, for example, a column select signal $Y_0$ has a high level and all other signals $Y_n$ have a low level, a signal of the selected memory cell appears on the digit lines $D_0$, $\overline{D_0}$. When, for example, the transistor $Q_1$ is turned on and the transistor $Q_2$ is turned off in response to the above signal, the sense current Is flows into the sense resistance $R_{S1}$ and the output $S_1$ becomes low. On the other hand, since the transistor $Q_2$ is turned off, no current flows into the resistor $R_{S2}$ and the output $S_2$ is high.

Under such a condition, when the clock signal CL is switched into a level higher than the column select signal $Y_0$, the sense current Is flows into either the transistor $Q_{L1}$ or $Q_{L2}$ via the transistor $Q_{L3}$. In this case, the output $S_1$ and output $S_2$ are low and high, respectively, such that the transistor $Q_{L1}$ is turned on and the transistor $Q_{L2}$ is turned off. Therefore, the condition is latched in which the output $S_1$ has the low level and the output $S_2$ has the high level. Under this condition, the high level of the clock signal $\overline{CL}$ is higher than the high level of the column select signals $Y_0$ to $Y_n$, and the latched condition is not affected even when the column select signal is switched.

When a negative pulse is applied to the clock $\overline{CL}$ after the column select signal has been switched, the next data is latched. In FIG. 8, the sense output and the feedback output are taken out from the same emitter follower. It is, however, also allowable to provide separate emitter followers (the same holds true in the subsequent embodiments). The sense circuit of the present invention can be operated quite in the same manner as the existing sense circuits provided the clock signal $\overline{CL}$ is fixed to the low level (the same also holds true in the subsequent embodiments).

In the write cycle of the memory cell, the clocks may be input maintaining the same timing as the read cycle, or the clock to the sense circuit may be inhibited such that the data of the previous cycle is held. In order that the output of the low level or the high level is necessarily produced during the write cycle, furthermore, current switches constituted similarly to the transistors $Q_{L1}$, $Q_{L2}$ and $Q_{L3}$ may further be provided in parallel, in order to forcibly take out the data having the low level or the high level in response to a clock of the high level higher than that of the clock $\overline{CL}$ (such a constitution can also be employed even in the subsequent embodiments).

Figure 9:
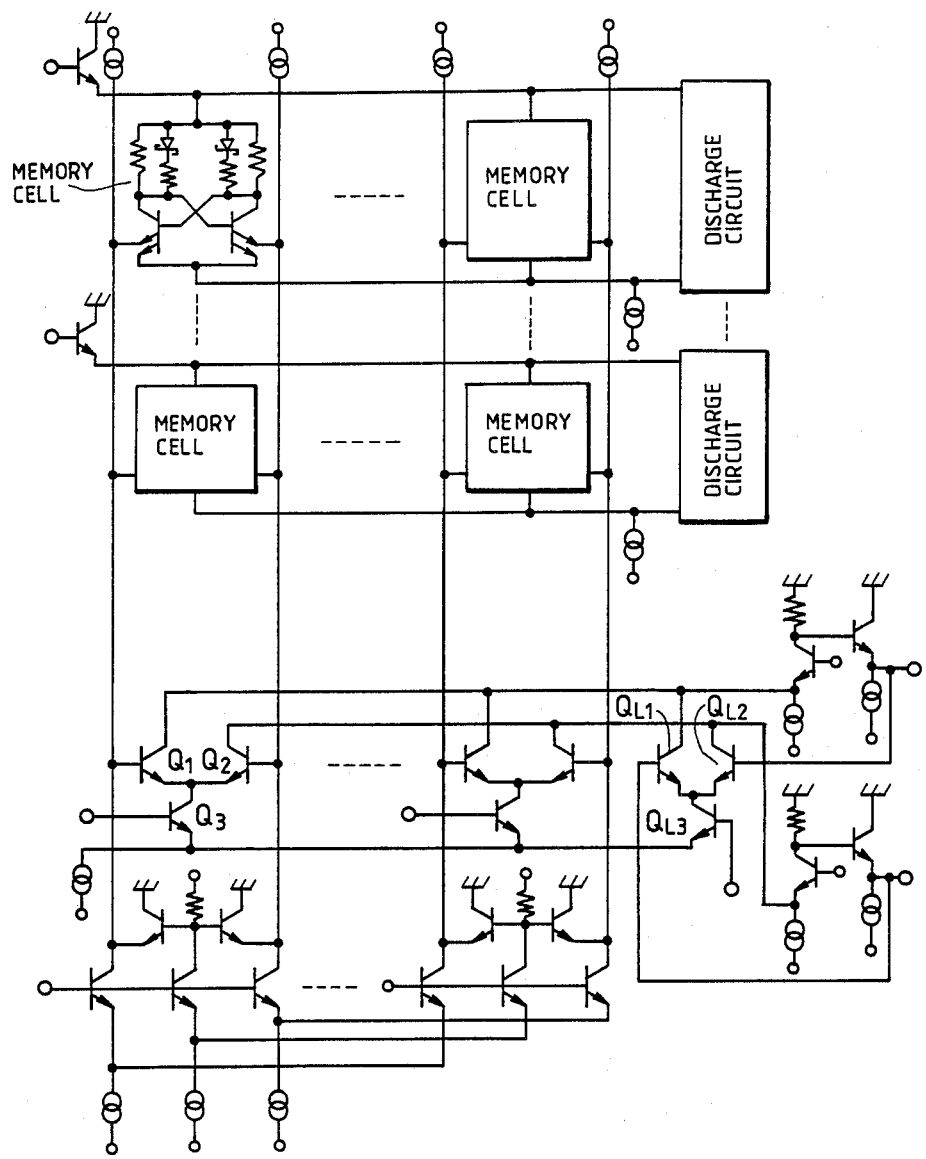
FIGS. 9 and 10 are diagrams illustrating the constitutions of sense circuits of FIG. 2 provided with a latch circuit according to other embodiments of the present invention.

FIG. 9 illustrates a further embodiment in which the sense circuit of FIG. 2 is provided with a latch function.

The embodiment of FIG. 9 is almost the same as the embodiment of FIG. 8. In the embodiment of FIG. 9, however, a predetermined reference voltage is applied to the base of the transistor $Q_{L3}$, and an AND signal of the clock (positive pulse) and column select signal is applied to the base of the transistor $Q_3$. Operation is the same as that of FIG. 8.

Figure 10:
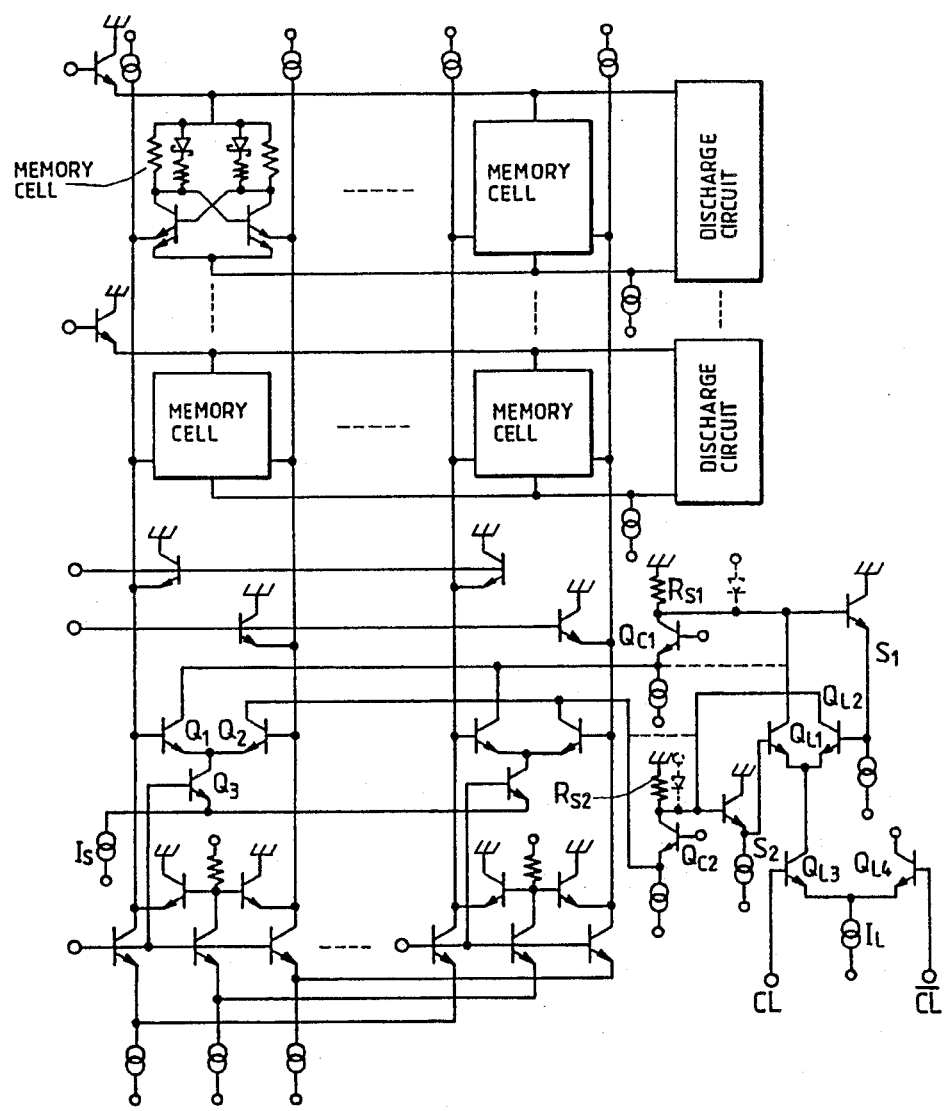

FIG. 10 illustrates a still further embodiment in which the sense circuit of FIG. 2 is provided with a latch function. In this embodiment, the latch circuit is constituted by a series gate consisting of transistors $Q_{L1}$ to $Q_{L4}$ and a current source $I_L$, which does not switch the current Is of the sense circuit to the latch. Instead, a relation $I_L > 2Is$ is maintained. Therefore, under the latched condition in which the transistor $Q_{L3}$ is turned on, the current $I_L$ is greater than the sense current Is; i.e., levels of the outputs $S_1$ and $S_2$ change but the relation of magnitude does not change, and the data is latched even when the sense current Is is switched. When the transistor $Q_{L3}$ is turned off, the relationship of levels of the outputs $S_1$ and $S_2$ is determined depending upon the data read from the memory cell. When the clock is switched and the transistor $Q_{L3}$ is turned on under this condition, the amplitudes of the outputs $S_1$ and $S_2$ increase maintaining the same condition which is then latched. Depending upon the design, furthermore, the collector of the transistor $Q_{C1}$ may be clamped with a diode as indicated by a broken line. Furthermore, the collectors of the transistors $Q_{L1}$ and $Q_{L2}$ may not be connected to the collectors of the transistors $Q_{C1}$ and $Q_{C2}$, but may be connected to the emitters thereof as indicated by broken lines.

Figure 3:
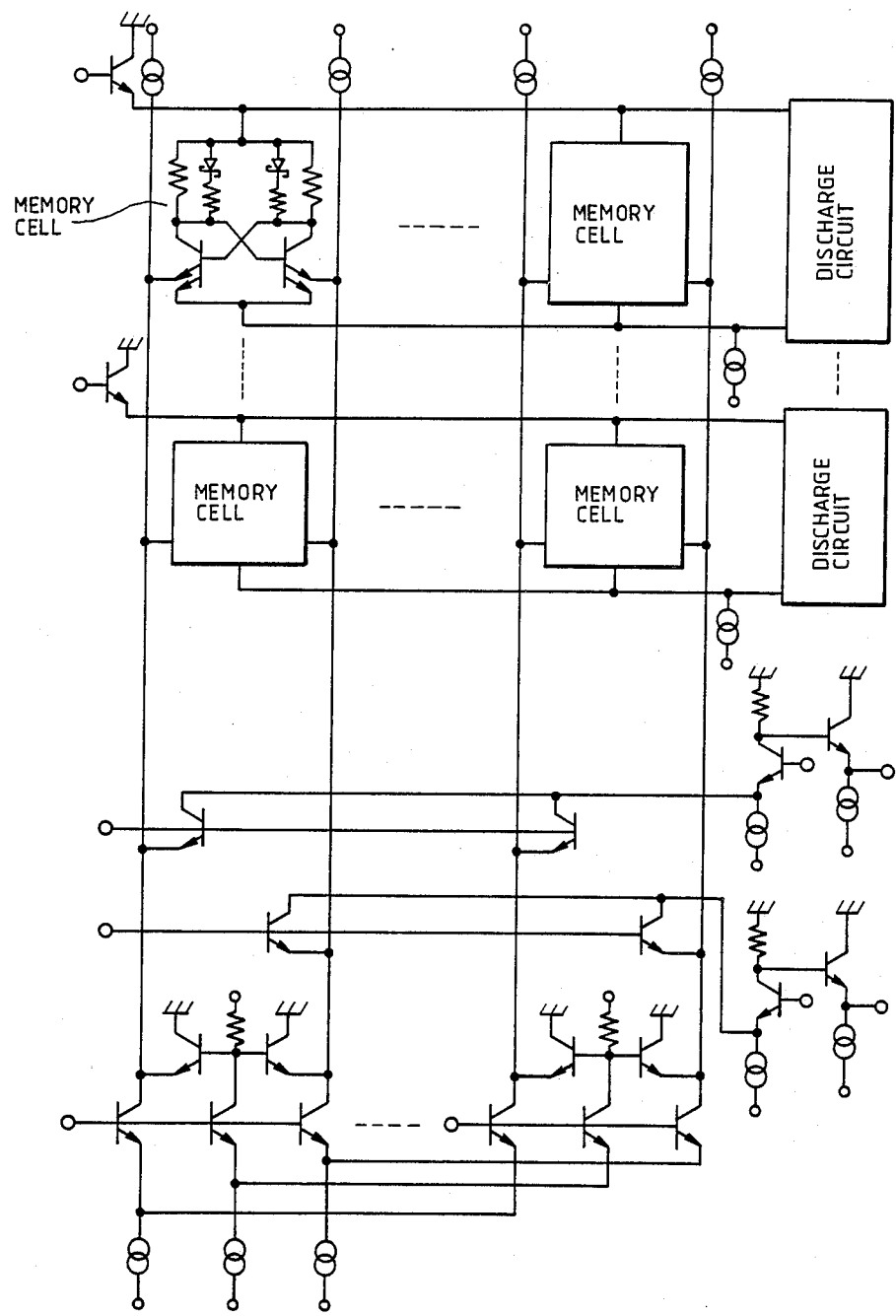
Figure 11:
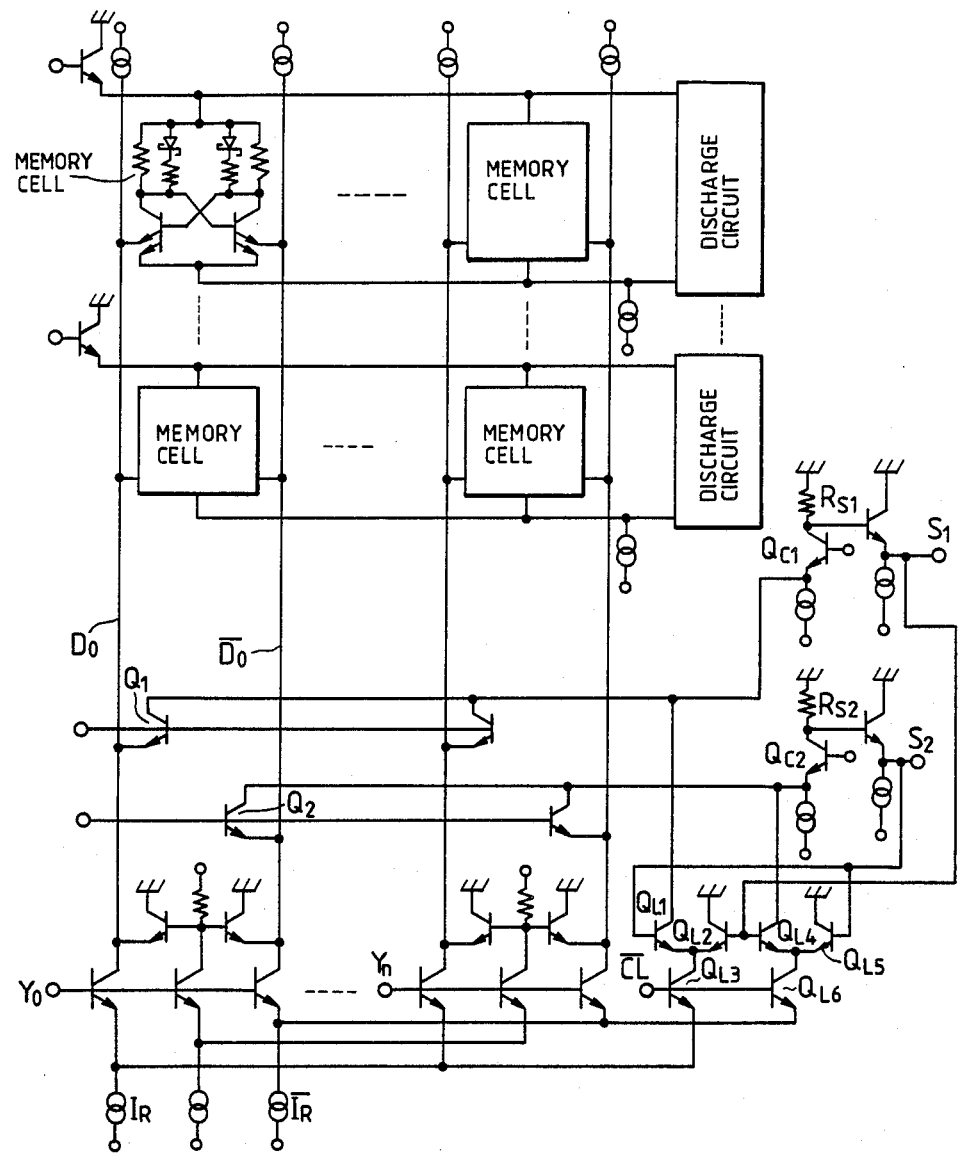
FIGS. 11 and 12 are diagrams illustrating the constitutions of sense circuits of FIG. 3 provided with a latch circuit according to further embodiments of the present invention.

FIG. 11 illustrates an embodiment in which the sense circuit of FIG. 3 is provided with a latch function. In this embodiment, emitters of the sense transistors $Q_1$ and $Q_2$ are not commonly connected. Therefore, provision is made of a latch circuit consisting of transistors $Q_{L1}$, $Q_{L2}$ and $Q_{L3}$, and a latch circuit consisting of transistors $Q_{L4}$, $Q_{L5}$ and $Q_{L6}$. It is now presumed that the clock $\overline{CL}$ signal has the low level, the column select signal $Y_0$ has the high level, a sense system consisting of $Q_1$ and $Q_2$ is selected, the transistor $Q_1$ is turned on and the transistor $Q_2$ is turned off. As a result, a current flows into the resistance $R_{S1}$, so that the output $S_1$ assumes the low level and the output $S_2$ assumes the high level. When the clock signal $\overline{CL}$ assumes the high level (greater than the high level of column select signal $Y_0$) under this condition, the currents $I_R$ and $\overline{I_R}$ flow into the transistors $Q_{L3}$ and $Q_{L6}$. The current that flows through the transistor $Q_{L3}$ further flows into the transistor $Q_{L1}$ or $Q_{L2}$ according to the levels of the outputs $S_1$ and $S_2$. In this case, the output $S_1$ assumes the low level and the output $S_2$ assumes the high level, and whereby the transistor $Q_{L1}$ is rendered conductive so that the current $I_R$ flows through the resistance $R_{S1}$. Similarly, the current $\overline{I_R}$ flows through the transistor $Q_{L5}$ and does not flow into the resistance $R_{S2}$. Therefore, the data is latched. Under this condition, the data that is latched does not change even when the column select signals $Y_0$ to $Y_n$ are switched, in the same manner as the aforementioned embodiments.

In this embodiment, the latch-holding condition must be released during the write cycle. Therefore, the clock signal $\overline{CL}$ must be maintained at the low level during the write cycle. The logic circuit therefor has been widely known among people skilled in the art, and is not described here.

Figure 12:
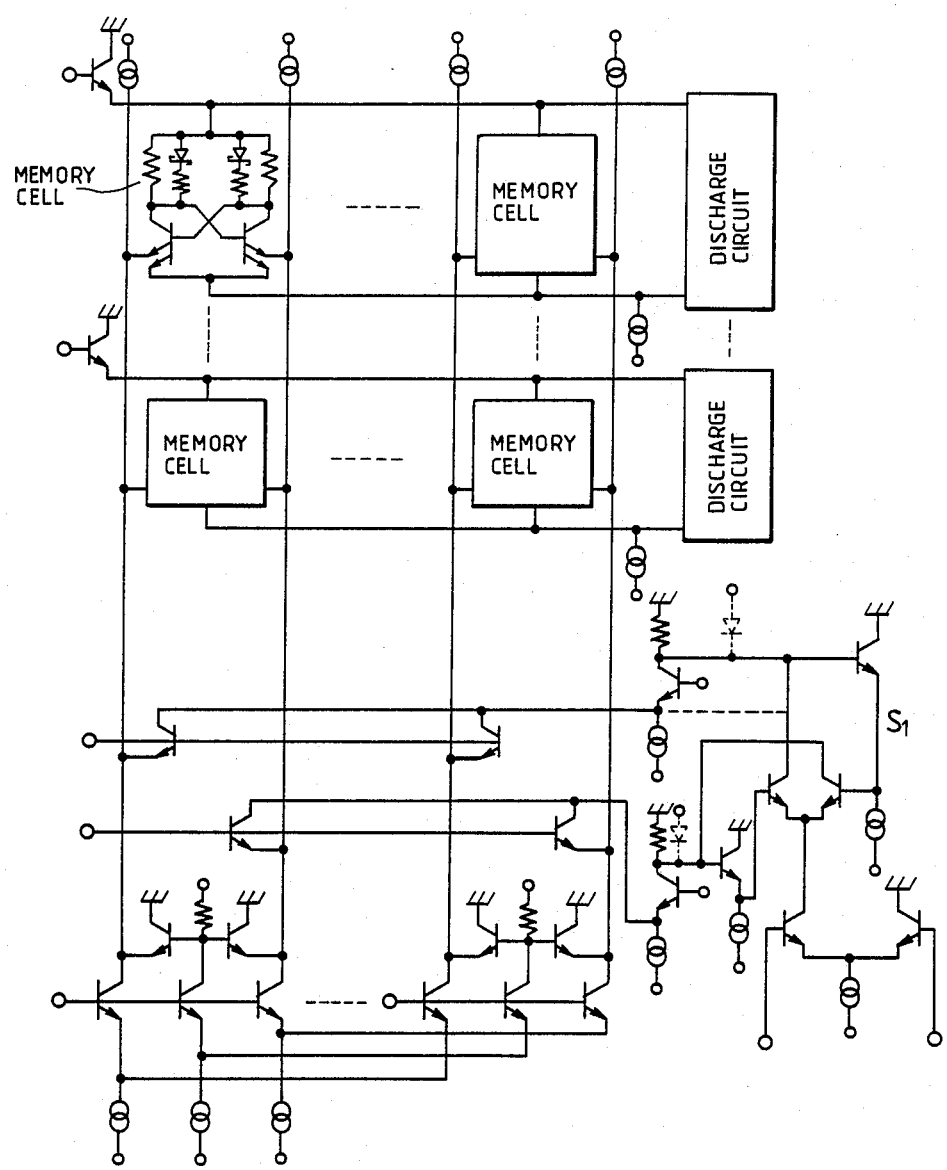

FIG. 12 illustrates an embodiment in which the sense circuit of FIG. 3 is provided with a latch function in the same method as the circuit of FIG. 10. Operation is the same as that of FIG. 10 and is not described here.

Figure 4:
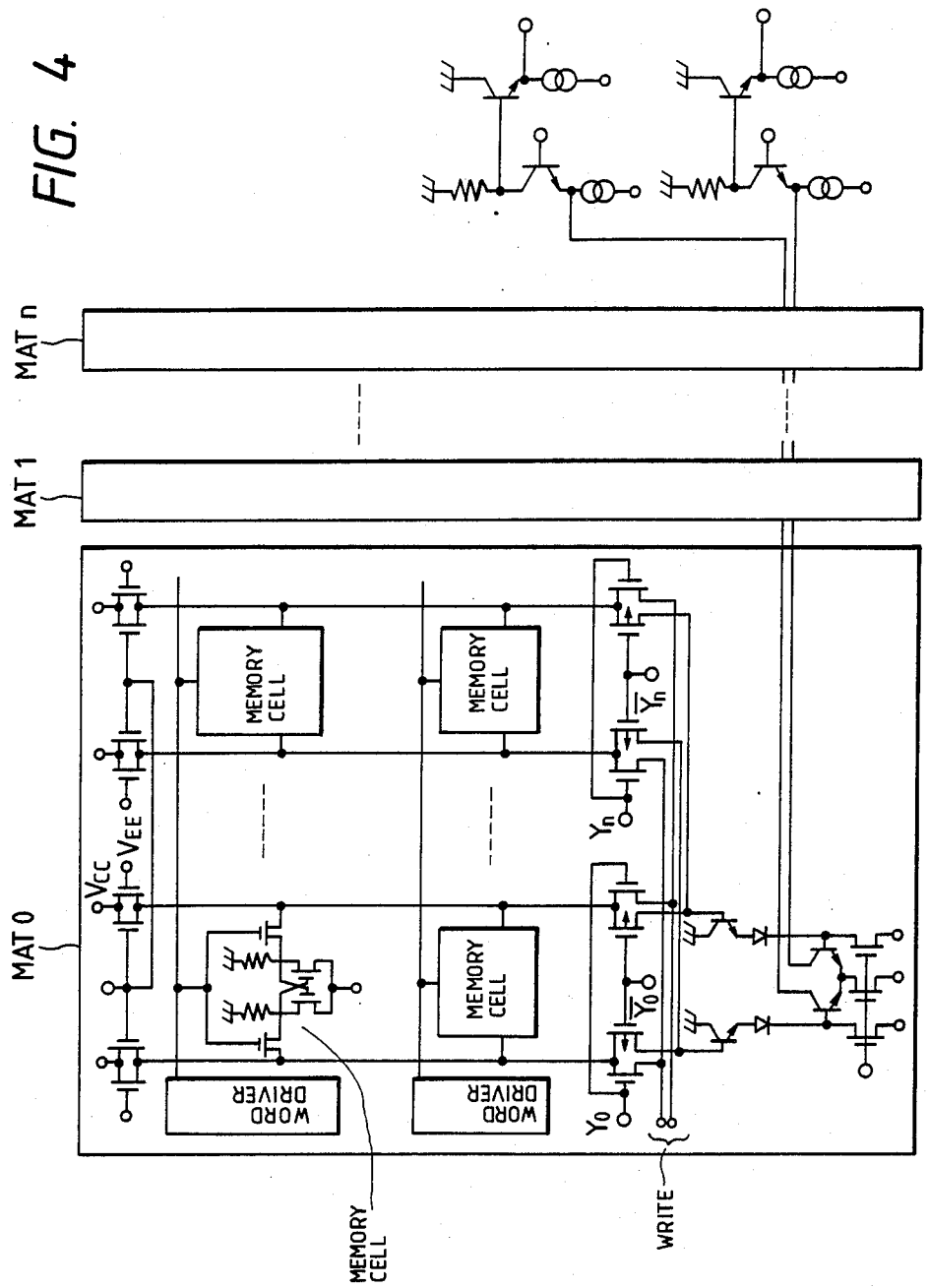
Figure 13:
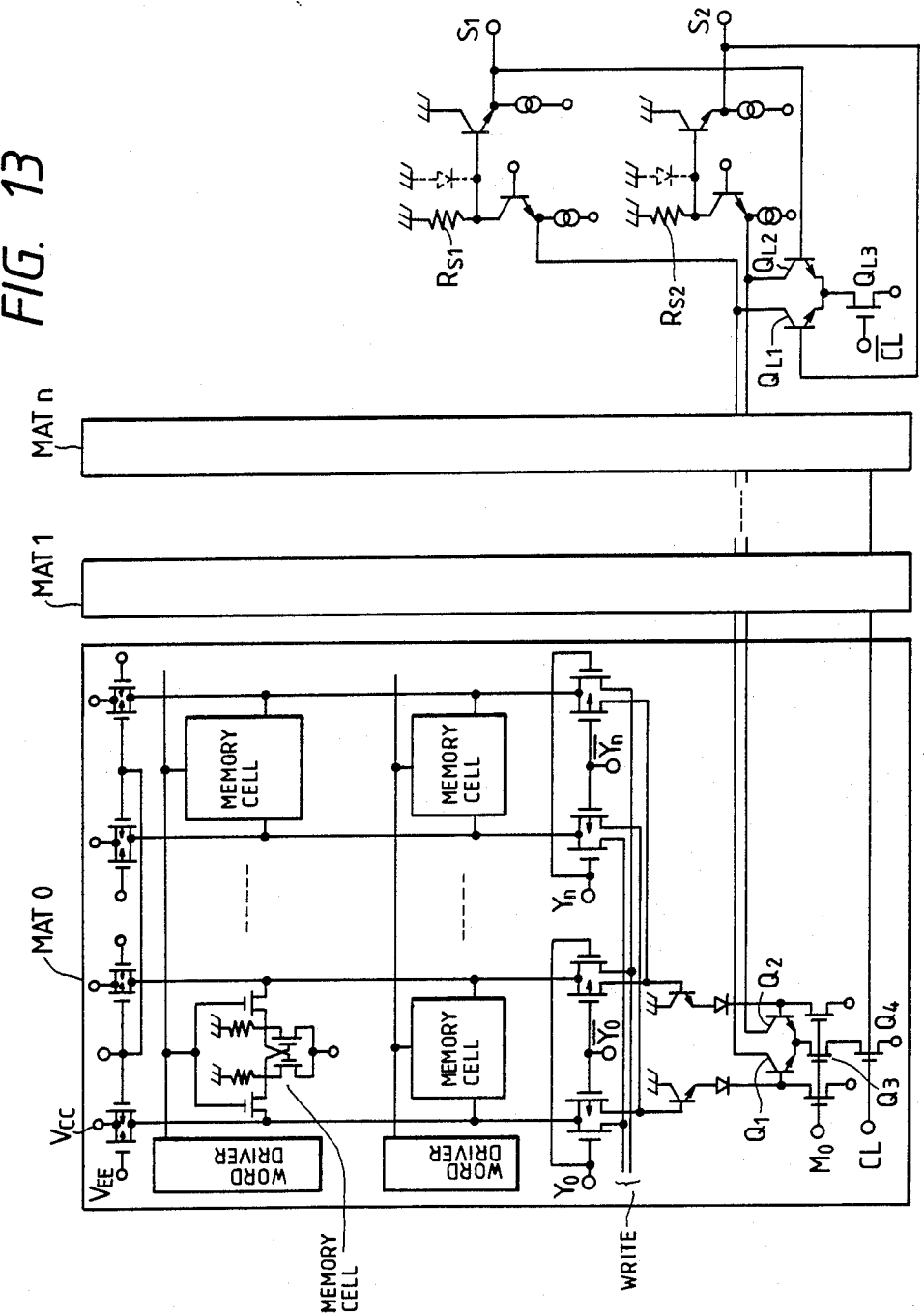
FIG. 13 is a diagram illustrating the constitution of the sense circuit of FIG. 4 provided with a latch circuit according to a still further embodiment of the present invention.

FIG. 13 illustrates an embodiment in which the present invention is adapted to the sense circuit of a BiCMOS circuit of FIG. 4. It is now presumed that the clock signal CL has the high level, the clock signal $\overline{CL}$ has the low level, the mat select signal MO has the high level, and the sense circuit consisting of transistors $Q_1$ and $Q_2$ is selected. Either the transistor $Q_1$ or $Q_2$ is turned on or off according to the data stored in the selected memory cell. For example, let it be presumed that the transistor $Q_1$ is turned on and the transistor $Q_2$ turned off. That is, a current flows into $R_{S1}$ so that the output $S_1$ assumes the low level and the output $S_2$ assumes the high level. Under this condition, when the clock CL assumes the low level and the clock $\overline{CL}$ assumes the high level, the transistor $Q_{L1}$ is turned on and the transistor $Q_{L2}$ is turned off just like the aforementioned embodiments and the data is latched.

In the foregoing were described the sense circuits of the present invention by way of particular sense circuits shown in FIGS. 2 to 4. However, it needs not be pointed out that the present invention can further be adapted to sense circuits of any other form.

Next, embodiments of the semiconductor circuit used for the decoder circuit of the present invention will be described.

FIG. 14 is a diagram illustrating the constitution of a decoder circuit according to an embodiment of the present invention.

The decoder circuit is constituted by a plurality of buffer circuits and a plurality of NAND gates. A buffer circuit XBO consists of two transistors $Q_1$ and $Q_2$, two resistors $R_1$ and $R_2$, and two emitter followers (transistor $Q_3$, current source $I_E$, transistor $Q_4$ and current source $I_E$). Though not diagramed other buffer circuits XB1 to XB5 are also constituted in the same manner. Outputs of these buffer circuits are applied to the bases of input transistors of a NAND gate GO, respectively.

The NAND gate GO is constituted by an ECL gate that consists of six input transistors $Q_{C1}$ to $Q_{C6}$ and a reference voltage transistor $Q_{C7}$. In this embodiment, in particular, collectors of the transistors $Q_{C1}$ to $Q_{C6}$ are clamped by a transistor $Q_{C9}$, and the amplitude at the collector node is suppressed to be as very small as several tens of millivolts. The voltage amplitude at the common collector node is determined by a ratio of a gate current $I_{CS}$ of the ECL to a bias current Ib that flows into the transistor $Q_{C8}$. That is, since the base of the transistor $Q_{C3}$ is connected to a predetermined voltage $V_{CL}$, the potential at the common collector C is determined by $V_{CL} - V_{BE}$ where $V_{BE}$ denotes a voltage across the base and the emitter of the transistor $Q_{C3}$. Here, the voltage $V_{BE}$ is determined by the emitter current, and a difference $\Delta V$ of $V_{BE}$ when the current are $I_2$ and $I_1$ is expressed by, $$\Delta V = V_{BE}(I_2) - V_{BE}(I_1)$$
$$= k \cdot T/q \ln(I_2/I_1)$$

where k denotes Boltzmann's constant, T denotes a junction temperature expressed by the absolute temperature, and q denotes the electric charge of an electron. At room temperature, $kT/q \approx 26$ mV. Therefore, if $Ib = I_{CS}$, the difference in voltage at the common collector node $$\Delta V \approx 26 \times ln2 \approx 20 \, mV$$

occurs between the condition at the emitter current $I_2 = I_{CS} + Ib$ of the transistor $Q_{C8}$ where the current $I_{CS}$ flows through any one of the transistors $Q_{C1}$ to $Q_{C6}$ and the condition at the current $I_1 = I_b$ where none of these transistors conducts.

As the ratio of $I_2/I_1$ approaches 1, the voltage change decreases and the high-speed operation is realized even when the stray capacity increases at the node C as a result of increase in the number of inputs of NAND gates. As the bias current Ib increases, however, the high level in the output of the NAND gate decreases giving rise to the occurrence of inconvenience depending upon the cases. Therefore, when, for example, $Ib = (1/10)I_{CS}$, the voltage change is given by $$\Delta V \approx 26 \times ln(11) \approx 62mV$$

and when $Ib = (1/20)I_{CS}$, the voltage change is given by $$\Delta V \approx 26 \times ln(21) \approx 79mV$$

The voltage change of the above order is still so small that the operation can be carried out at high speeds. When, for example, $Ib = I_{CS}/100$, $\Delta V \approx 120$ mV from which it is expected that the operation can be carried out at a considerably high speed. When the current source Ib is not used, on the other hand, the current $I_1$ that flows into the transistor $Q_{C8}$ consists of a leakage current only under the condition where the transistors $Q_{C1}$ to $Q_{C8}$ are turned off, and the voltage change at the common collector node C becomes about 0.6 V (though it may vary depending upon the characteristics of the processing device) and the delay time increases to a considerable degree.

In this embodiment, the output of the NAND gate (decoder) is taken out from the collector C' of the transistor $Q_{C8}$ via the transistor $Q_{C9}$ (current source $I_F$) of the emitter follower. As will be described later, this output is used for driving the word lines and for driving the bit line select circuit. The stray capacity at the node C' stems from the transistors $Q_{C8}$, $Q_{C9}$ and resistor $R_L$ irrespective of the number of inputs of the NAND gates, and is very small. Therefore, the NAND gates in the decoder of the present invention can be operated at high speeds irrespective of the number of inputs. As shown in FIG. 14, therefore, the NAND gate may have six inputs, and the buffer circuit may be so constituted as to directly drive the NAND gate instead of effecting the wired OR. With this constitution, no delay results from the wired OR. Furthermore, the NAND gate operates at a sufficiently high speed even when the number of inputs is large, and the decoder circuit can be constituted which as a whole operates at very high speeds. In FIG. 14, the current sources of emitter followers are all arranged near the emitters of the emitter followers. With the above arrangement, there is no need of flowing a large emitter follower current to the decoder lines $\overline{X_0}, \ldots, \overline{X_5}$; i.e., width of the decoder lines can be reduced contributing to the increases in the degree of integration. Furthermore, the power source potentials Vcc' and Vcc" may be set at suitable values depending upon the design.

FIG. 15 is a diagram illustrating the constitution of a decoder circuit according to another embodiment of the present invention. In this embodiment, two emitter followers are driven by the outputs of the buffer circuit to effect two wired OR's. The delay time increases little provided the wired OR's are formed in a number of two or so. Therefore, an optimum number of the wired OR's and an optimum number of inputs of NAND gates should be determined by taking into consideration the increases in the delay time and the decrease in the delay time in the NAND gate. In the embodiment of FIG. 15, only three input transistors $Q_{C1}$, $Q_{C2}$ and $Q_{C3}$ are used to simplify the constitution of the NAND gate. Further, the common collector node is clamped by the transistor $Q_{C8}$ to suppress the voltage amplitude at the collector node. The current source Ib has the same function as that of the embodiment of FIG. 14.

FIG. 16 is a diagram illustrating the constitution of a decoder circuit according to a further embodiment of the present invention. In this embodiment, emitter followers such as buffer circuit and NAND gate serve as Darlington emitter followers. The constitution in other respects is the same as the constitution of FIG. 14, and the description related to FIG. 14 should be referred to.

The Darlington emitter followers according to this embodiment are advantageous for driving a heavy load. The emitter followers need not entirely be the Darlington emitter followers, but either one of the buffer circuit or the NAND gate may be the Darlington emitter follower.

In the decoders of the above-mentioned embodiments, current sources of emitter followers such as $I_E$ and $I_F$ of FIG. 14 are diagramed as constant-current sources. Instead of the constant-current sources, however, discharge circuits may be used as current sources which supply a heavy current during the fall time of outputs of the emitter followers to increase the falling speed. As such discharge circuits, it is preferred to use discharge circuits of the delayed type shown in FIG. 17 that, during the fall time, permit discharge current to flow until the wave form is sufficiently low. FIG. 17(a) shows a circuit disclosed in Japanese Patent Laid-Open No. 59-112723 and FIG. 17(b) shows a circuit disclosed in Japanese Patent Application No. 62-128109. Use of these circuits makes it possible to solve a conflicting problem of high-speed operation consuming small amounts of electric power. It is of course allowable to use discharge circuits of any other constitution in addition to those shown in FIG. 17.

In the decoders of the aforementioned embodiments of FIGS. 14 to 17, the outputs of NAND gates are used for driving the word lines and for driving the bit line select circuit. That is, the outputs are applied to word lines $W_1$ to $W_n$ of a memory circuit consisting of a memory cell array and peripheral circuits and to inputs $B_1$ to $B_m$ of the bit line select circuit shown in FIG. 18. Discharge circuits for the word lines may be the circuits shown in FIG. 17, or may be other circuits such as the one disclosed in Japanese Patent Publication No. 43795/1986. Further, the memory cells may be those of the diode clamp type, those of the load resistance switching type based on SBD, or those of the pnpn type. The constitution of the memory cell array and the peripheral circuits as well as the operations thereof of FIG. 18 have been widely known, and are not described here.

FIG. 19 is a diagram illustrating the constitution of a multi-input ECL gate according to a still further embodiment of the present invention. The aforementioned embodiments of FIGS. 14 to 16 have dealt with the decoder circuits to produce negation outputs only. This embodiment, however, produces an OR output in addition to NOR output. As described above, the semiconductor circuit of the present invention can be adpated to circuits other than the decoder circuits. The OR side is constituted by a $V_{BB}$ transistor, and the common collectors need not be clamped by the transistor $Q_{C8}$ that is usually done on the NOR side (the common collectors may, of course, be clamped, as required). To bring the levels into agreement between the OR side and the NOR side, a bias current $Ib_2$ which is the same as the bias current $Ib_1$ of the NOR side is subtracted from the OR side. Depending upon the cases, the current $Ib_2$ may be replaced by the current $Ib_1$. Or, the current may not be used if it is not necessary.

Figure 20:
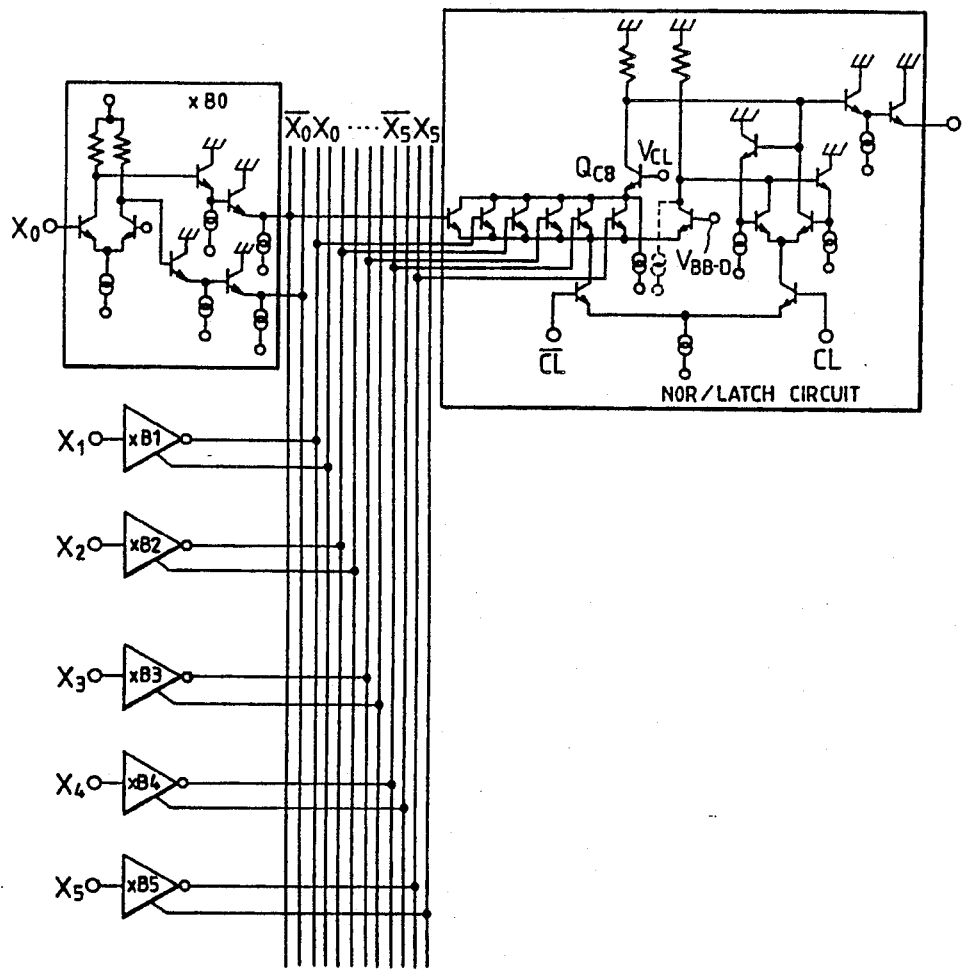

FIG. 20 is a diagram illustrating the constitution of a decoder circuit according to a still further embodiment of the present invention, wherein the NOR/latch (flip-flop) circuit is constituted by ECL gates. The buffer circuits are the same as those of FIG. 17.

The NOR/latch circuit is of the series gate type wherein common collectors of transistors constituting a multi-input gate are clamped by the transistor $Q_{C8}$. Differential operation is effected by applying a signal (clock) $\overline{CL}$ of a phase opposite to that of the clock CL to hold the decoder output and to receive the next decoder output. By using a reference voltage $V_{BB-C}$ instead of the clock $\overline{CL}$ (or CL), furthermore, it is allowable to hold the decoder output during the period where the clock CL that is input assumes the high level ($\overline{CL}$ assumes the low level) and to receive the next decoder output when the clock CL that is input assumes the low level ($\overline{CL}$ that is input assumes the high level).

Figure 21:
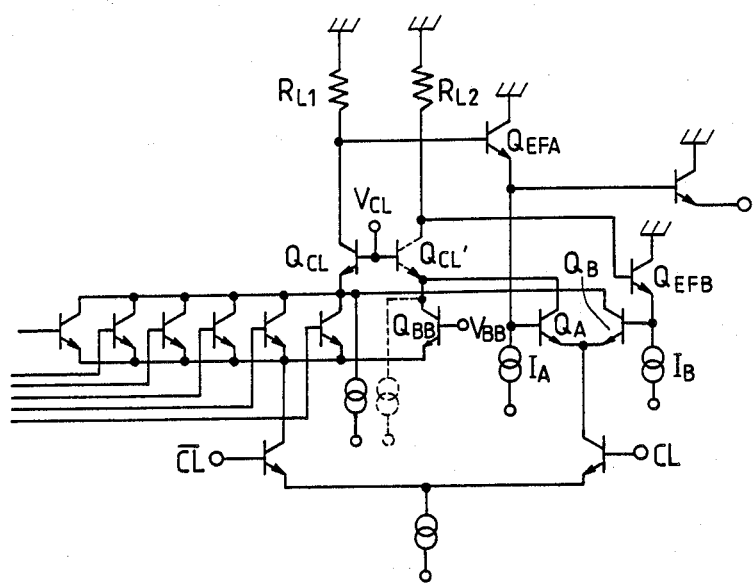

FIG. 21 is a diagram illustrating the constitution of a decoder circuit according to a yet further embodiment of the present invention. FIG. 21 shows the NOR/latch circuit only in the circuit constitution of FIG. 20. In this embodiment, the collector of the transistor $Q_B$ is connected to the emitter of the transistor $Q_{CL}$ (common collector node of the ECL gate). Similarly, the collector of the transistor $Q_A$ is connected to the emitter of the transistor $Q_{CL}'$. It is, of course, allowable to omit the transistor $Q_{CL}'$ like the case of FIG. 20. In this case, collectors of the transistors $Q_A$ and $Q_{BB}$ are directly connected to the resistor $R_{L2}$ without passing through the transistor $Q_{CL}'$. It is allowable to omit the bias current source (indicated by a broken line in FIG. 21) as a matter of course.

Figure 22:
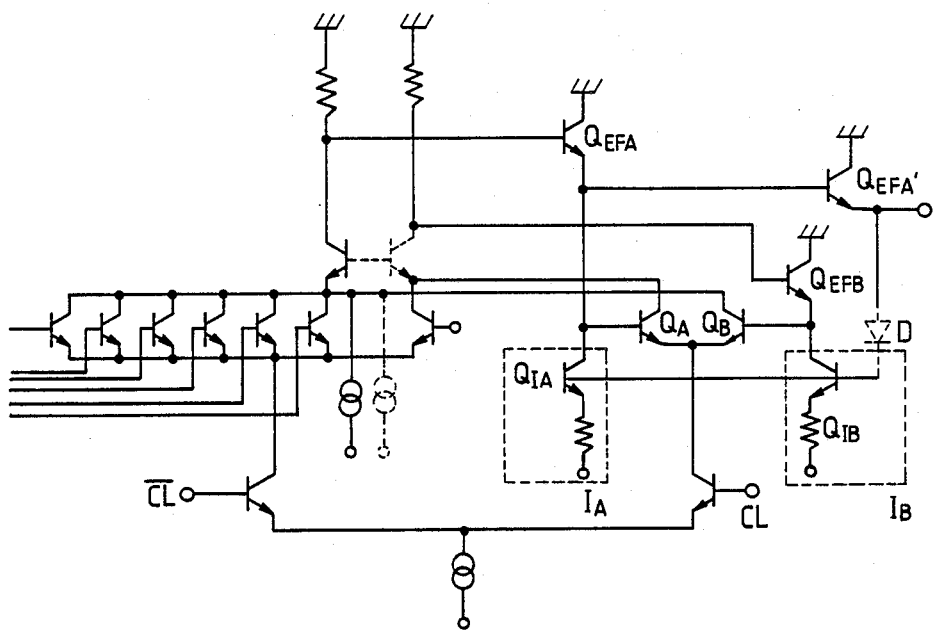

FIG. 22 is a diagram illustrating the constitution of a decoder circuit according to a further embodiment of the present invention. Like FIG. 21, FIG. 22 illustrates the NOR/latch circuit only in the constitution of FIG. 20. In this embodiment, current sources $I_A$ and $I_B$ of the emitter followers $Q_{EFA}$ and $Q_{EFB}$ are substituted by a current source of the concentrated type. When the emitter follower $Q_{EFA}$ produces an output of the high level, the current source transistors $Q_{IA}$ and $Q_{IB}$ are turned on to flow the currents. In this case, an output of the low level produced from the emitter follower $Q_{EFB}$ is discharged by the current source $I_B$ and rises quickly. At the time when the emitter follower $Q_{EFA}$ switches to a low level, the current flowing into the current source $I_A$ is permitted to flow for only a short period of time, so that the emitter follower $Q_{EFA}$ switches quickly. When such a current source is used, only one of the decoder outputs is turned on at a time, and $I_A$ and $I_B$ are on only in that output, power sources $I_A$ and $I_B$, thus making it possible to greatly reduce the consumption of electric power. Here, the diode D works to shift the level in order to prevent the transistors $Q_{IA}$ and $Q_{IB}$ from being saturated, and may not be provided depending upon the design.

Figure 23:
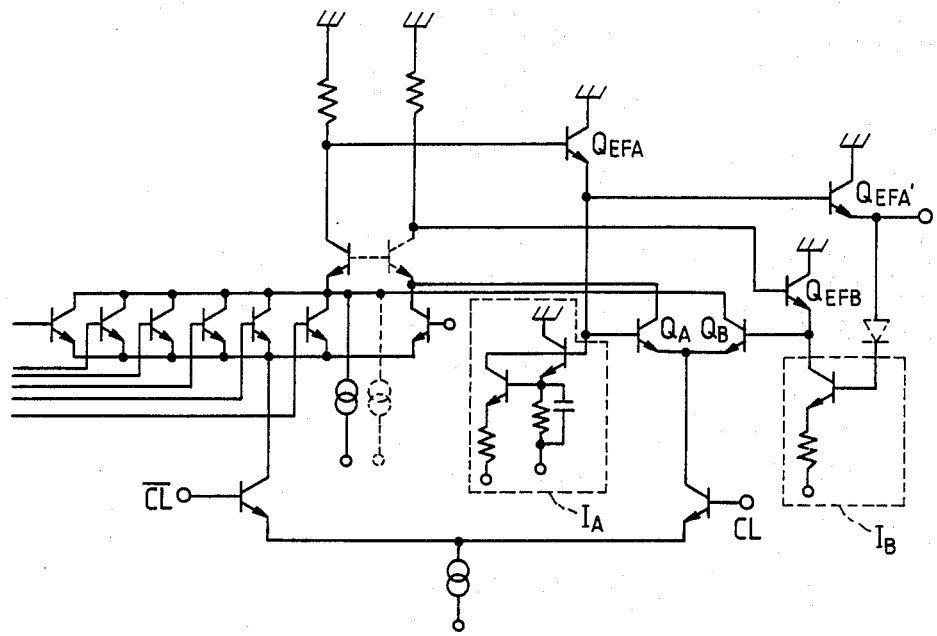

FIG. 23 illustrates another embodiment which employs the current source $I_A$ of FIG. 22 but that is modified into the one of the delay type to continuously flow the discharge current for a predetermined period of time even after the output of the emitter follower $Q_{EFA}$ has switched to a low level. Therefore, the emitter follower $Q_{EFA}$ can be switched at a very high speed compared with the case of FIG. 22.

With the decoder circuit being constituted as described above, it is allowed to have the logic circuit functions, that had so far existed around the memory LSI, incorporated in a memory chip in order to realize a computer system that as a whole operates at high speeds maintaining improved performance.

Using the semiconductor circuit of the present invention as described above, it is possible to provide an ECL gate that operates at very high speeds by clamping the common collector node of a multi-input ECL gate having large stray capacity with a clamping transistor. Furthermore, the decoder circuit constituted by using this gate operates at very high speeds even when the NOR gates of ECL has many inputs. Therefore, no wired OR for decoding is required for the buffer circuit, or the number of wired OR's may be very small, making it possible to obtain a decoder circuit which as a whole operates at a very high speed. The decoder circuit can be suitably used as an address decoder for the memory device of the present invention.

The aforementioned embodiments have all dealt with the decoder circuits. However, it needs not be pointed out that the aforementioned circuits can be adapted as high-speed ECL gates to any other logic circuit.

FIG. 24 illustrates constitutions of buffer circuits having latch function that can be suitably used as address buffers 3, 3', output buffer 6, data input buffer 7, write enable buffer 8 and read/write buffer 9 that were not closely described in the aforementioned embodiments among the constitutional elements shown in FIG. 5.

When the clock signal CL has the low level ($\overline{CL}$ has the high level), the current $I_{CS}$ flows through a transistor $Q_{CL1}$, whereby a current switch consisting of the transistors $Q_A$, $Q_B$ and $Q_R$ operates to produce an output depending upon the values of inputs A and B (the current switch constitutes two-input OR and NOR circuits). When the clock signal CL is at the high level, the current $I_{CS}$ flows through the transistor $Q_{CL2}$ so that the current switch consisting of the transistors $Q_{L1}$ and $Q_{L2}$ opeates. The current switch is coupled in a crossing manner through the emitter follower transistors $Q_{EF1}$ and $Q_{EF2}$ thereby to constitute a flip-flop. Therefore, as the clock CL is switched to the high level, the condition of just before being switched is held (latched). Under this condition, the data that is held does not change no matter how the inputs A and B are changed. The data is held until the clock CL is switched to the low level. When the clock CL is switched to the low level, the next data is received.

We claim:
1. A semiconductor memory device comprising:
(1) a memory cell array;
(2) means for accessing a memory cell in said memory cell array; and

(3) means for reading out data from the accessed memory cell, said means for reading out the data includes means for holding a signal of the data read out, the holding means including:

first circuits electrically coupled to respective digit lines of the memory cell array for detecting read out data, only a corresponding one of said first circuits detecting the data signal read out from the accessed memory cell, a second circuit electrically coupled to said first circuits such that said corresponding one of said first circuits and said second circuit act together as a single latch circuit for holding the read out data signal.

2. A semiconductor device according to claim 1, wherein said accessing means includes an address decoder circuit that incorporates the holding means therein.

3. A semiconductor memory device comprising:

a memory cell array including a plurality of memory cells arranged in X- and Y-directions;

an accessing means for accessing a selected one of the memory cells in said memory cell array, said accessing means including address buffer circuits and address decoder circuits corresponding to said X- and Y-directions, such that the selected memory cell is accessed in response to an output of the address decoder circuit; and, a reading means for reading out data from the memory cells, said reading means including a sense circuit that reads out the data stored in said accessed memory cell, said sense circuit comprising:

a plurality of transistor pairs for reading out signals from said memory cell array, the pairs of transistors being collector-dotted and a read current being supplied to one of the collector-dotted transistors via a load resistor to read a signal, a current switch wherein said signal that is read out is fed back to said current switch, controlled by a clock and is supplied to one of the collector-dotted portion and said current switch in order to latch the data.

4. A semiconductor memory device according to claim 3, wherein said reading means includes an output buffer circuit.

5. A semiconductor memory device according to claim 4, wherein said address buffer circuits, said address decoder circuits and said output buffer circuit each include a latch circuit.

6. A semiconductor memory device according to claim 5, wherein said semiconductor memory device includes clock signal means and a means for carrying out a pipeline operation utilizing the latch circuits contained in said sense circuit, said address buffer circuits, said address decoder circuits and said output buffer circuit, and said clock signal means.

7. A semiconductor memory device according to claim 3 wherein said current switch is connected in parallel with a sense output portion of said sense circuit.

8. A semiconductor memory device according to claim 7 wherein said current switch has a function for latching a signal from said sense output portion.

9. A semiconductor memory device comprising:

a memory cell array including a plurality of memory cells arranged in X- and Y-directions;

an accessing means accessing a memory cell in said memory cell array, said accessing means including address buffer circuits and address decoder circuits corresponding to said X- and Y-directions, such that a selected memory cell is accessed in response to an output of the address decoder circuit, each of said address decoder circuits including:

a plurality of input transistors of which the emitters and collectors are commonly connected, a reference voltage transistor of which the emitter is commonly connected to the emitters of the input transistors, and a suppress means for suppressing the potential change of the common collectors, said suppress means including a transistor of which the emitter is connected to the common collectors of said plurality of input transistors, of which the base is connected to a voltage source of low impedance, and of which the collector is connected to a load resistor;

a reading means for reading data from the memory cells; and, a latch means for holding the read data, the latch means being connected in parallel with an output line of the reading means.

10. A semiconductor memory device according to claim 9 wherein a current source is connected to said common collectors of said plurality of input transistors.

11. A semiconductor memory device according to claim 9 wherein outputs of plurality of buffer circuits are applied to the bases of said plurality of input transistors.

12. The semiconductor memory device according to claim 9 wherein said reading means further includes an output buffer circuit.

13. The semiconductor memory device according to claim 12 wherein said address buffer circuits, said address decoder circuits and said output buffer circuit include a latch circuit.

14. The semiconductor memory device according to claim 13 wherein said semiconductor memory device includes clock signal means and a means for carrying out a pipeline operation utilizing the clock signal means and the latch circuits of said sense circuit, said address buffer circuits, and said address decoder circuits.

15. A semiconductor memory device capable of high speed operation, the semiconductor memory device comprising:

a memory cell array comprising a plurality of memory cells arranged in X- and Y-directions;

accessing means for accessing at least one of the plurality of memory cells arranged in X- and Y-directions, the accessing means including address buffer circuits and address decoder circuits, said address decoder circuits including a reference voltage transistor and a means for suppressing a potential change located on the outputs of input transistors of the address decoder, the reference voltage transistor and the means for suppressing a potential change being operatively connected to the input transistors; and, reading means electrically coupled to the plurality of memory cells in the memory cell array for reading out data from the memory cell array, the reading means including a transistor configuration electrically coupled and connected in parallel to an output of the reading means for providing a latching function, the reading means selectively reads out data signals from a single one of the plurality of memory cells and latches the data signals whereby power consumption, semiconductor chip size, and cycle time are reduced as a result of integrating the latching function within the reading means and latching only one of the plurality of the memory cells at a time.

* * * * *